(12) United States Patent
Joshi et al.

(10) Patent No.: US 8,958,254 B2
(45) Date of Patent: Feb. 17, 2015

(54) HIGH PERFORMANCE TWO-PORT SRAM ARCHITECTURE USING 8T HIGH PERFORMANCE SINGLE PORT BIT CELL

(75) Inventors: Manish Chandra Joshi, Bangalore (IN); Parvinder Kumar Rana, Bangalore (IN); Lakshmikantha Vakwadi Holla, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 354 days.

(21) Appl. No.: 13/402,429

(22) Filed: Feb. 22, 2012

(65) Prior Publication Data

US 2013/0215689 A1    Aug. 22, 2013

(51) Int. Cl.
    *G11C 7/00*    (2006.01)
(52) U.S. Cl.
    USPC ............. 365/189.05; 365/203; 365/230.05; 365/233.11; 365/233.16; 365/233.17
(58) Field of Classification Search
    CPC ....... G11C 8/16; G11C 7/1075; G11C 11/412
    USPC ............. 365/230.05, 203, 189.05, 233.1, 365/233.11, 233.16, 233.17
    See application file for complete search history.

(56) References Cited

U.S. PATENT DOCUMENTS

| | | | |
|---|---|---|---|
| 7,623,404 B2 * | 11/2009 | Manickavasakam et al. | 365/226 |
| 7,626,854 B1 * | 12/2009 | Yang et al. | 365/154 |
| 7,643,330 B1 * | 1/2010 | Lin et al. | 365/154 |
| 7,742,326 B2 | 6/2010 | Houston | |

OTHER PUBLICATIONS

Chang, et al., An 8T-SRAM for Variability Tolerance and Low-Voltage Operation in High-Performance Caches, IEEE Journal of Solid-State Circuits, vol. 43, No. 4, Apr. 2008.

* cited by examiner

*Primary Examiner* — Son Dinh
(74) *Attorney, Agent, or Firm* — John R. Pessetto; Frederick J. Telecky, Jr.

(57) ABSTRACT

An 8T memory bit cell receives a clock signal and read and write address signals. A read address latch/clock circuit receives the clock signal and the read address signals and initiates a read operation during a first clock cycle state. A write address flip-flop/clock circuit receives the clock signal and the write address signals and initiates a write operation during a second clock cycle state. An inverter receives and inverts the clock signal and applies the inverted clock signal to the write address flip-flop/clock circuit. The read address latch/clock circuit initiates a read word line precharge operation during the second clock cycle state and a write word line precharge operation during the first clock cycle state. The write address flip-flop/clock circuit may also include a loose self-timer to end a write cycle is a clock signal continues beyond a predetermined time.

15 Claims, 9 Drawing Sheets

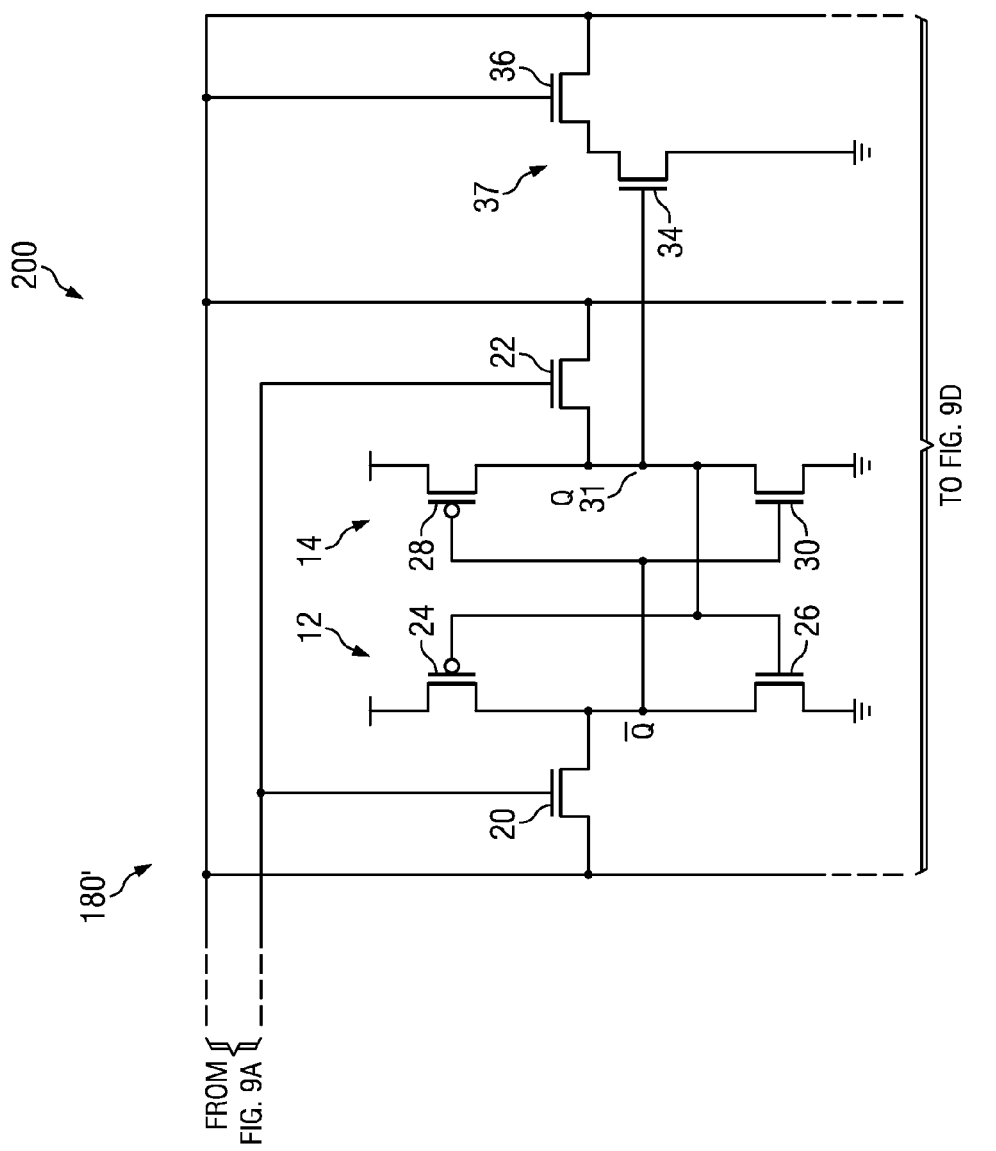

HIGH PERFORMANCE TWO-PORT SRAM ARCHITECTURE USING 8T HIGH PERFORMANCE SINGLE PORT BIT CELL

BACKGROUND

1. Field

The various circuit embodiments described herein relate in general to memory architectures and methods for accessing same, and more specifically to methods and circuit architectures for enabling substantially simultaneous read and write functions in a static random access memory (SRAM).

2. Background

Accessing a memory with read and write functions in a single clock cycle has been a continuous customer need. In the past, this has been accomplished using sequential rising and falling edges of the clock in a clock cycle. This is referred to as "two-port functionality." This enables twice the cycle time of a single-port memory to be achieved. However, timing mismatches and lower operating voltages that are being used with ever-increasingly smaller topologies limit the performance of the two-port functionality mode of operation.

An asynchronous feature has been employed that allows two-port functionality in a given clock cycle by making the asynchronous internal memory signal available. An example of this can be seen in memories that are included in embedded processor circuitry, such as compilers constructed around high performance RAM structures. This has helped overcome at least some of the performance limitations introduced by the dual-edge usage. However, the asynchronous feature clocks the memory at the highest speed available irrespective of the external clock. Hence, the memory is prone to timing mismatches. This often resulting in yield loss in production of the circuits.

An eight transistor (8T) bit cell has been developed in 28 nm technology that has addressed at least some of the needs of robust, high performance, two-port and single-port RAMs. The 8T bit cell considered the functionality of both the single port and two port memory topologies. This provided opportunity to design a two port architecture having the functionality of a read operation followed by a write operation. The two-port architecture helped to improve the performance limitations, but it still unable to achieve simultaneous read and write operations at the same bit cell. It additionally has potential errors that can lead to functional failures when accessing the same row in a memory array.

An electrical schematic diagram of a previously proposed 8T bit cell 10 is shown in FIG. 1, to which reference is now made. It is understood, of course, that the 8T bit cell 10 is only one of a number of bit cells of a memory array. The bit cells are arranged in rows and columns with each bit cell being individually addressable with appropriate row and column addressing signals and associated logic circuitry. Typically, the bit cells are arranged so that a predetermined number of bit cells can be concurrently addressed, for example, to store and deliver information in predetermined quantities, such as bytes, words, or the like.

The 8T bit cell 10 uses six transistors for a write operation and two transistors for a high performance read operation. The 8T cell has cross coupled inverters 12 and 14 that are respectively connected to write bit lines 16 and 18 (WBIT and $\overline{\text{WBIT}}$) by access or pass-gate transistors 20 and 22. The inverter 12 has a PMOS transistor 24 and an NMOS transistor 26 connected between VCC and ground, and the inverter 14 has a PMOS transistor and an NMOS transistor 30, also connected between VCC and ground. The gates of the PMOS transistor 24 and the NMOS transistor 26 of the inverter 12 are connected between the PMOS transistor 24 and an NMOS transistor 26 of the inverter 14. Likewise, the gates of the PMOS transistor 28 and the NMOS transistor 30 of the inverter 14 are connected between the PMOS transistor 24 and an NMOS transistor 26 of the inverter 14. The circuitry encircled by the dashed circle 32 is essentially a 6T bit cell (except that the lines designated as write bit lines 16 and 18 would also be used for a read function in a 6T mode of operation). In the 8T bit cell illustrated a stack 37 of NMOS transistors 34 and 36 is connected between the node between the PMOS transistor 24 and an NMOS transistor 26 of the inverter 14 and a read bit output line 38 (RBIT).

In operation, a read address signal (AR/EZR) is applied to a read address line 40 and synchronized with a clock signal on line 42 in a read address latch/clock circuit 44. A read control signal is developed on a read word line 46 (RWL). Similarly, a write address signal (AW/EZW) is applied to a write address line 48 and synchronized with the clock signal on line 42 in a write address latch/clock circuit 50. A write control signal is developed on write line 52 (WWL).

Data to be written to the memory cell 10 is applied from data input line 54 via data latch/decoding logic circuit 56 to the write bit lines 16 and 18. The output to be read from the circuit is sensed on line 38 by sensing logic and output driver circuitry 58, and delivered on output line 60.

The 8T bit cell 10 performs read and write operations in the same architectural context as a topology in which the two port operation can be performed. In the positive phase of clock, parallel write and read word lines can be activated based on the value of the read address (AW/EZR) and write address (AR/EZR) signals on respective read address line 40 and write address line 52. Thus, the bit cell in the array having both word lines on can be selectively addressed, allowing data from the data latch/decoding logic circuit 56 to be written into the bit cell 10, and allowing the internal value of the bit cell 10 to be read through the single ended sensing mechanism provided by the NMOS transistors 34 and 36 in the transistor stack 37. The periphery logic circuits, including the read address latch/clock circuit 44, the write address latch/clock circuit 50, the data latch/decoding logic 56, and the sensing logic and output driver 60 are designed so that the bit cell 10 can perform parallel operations, enabling the bit cell 10 to provide high-performance read and write operations.

In reading and writing to an 8T cell of the type described, a number of scenarios exist. When the read and write addresses are different, the read word line and the write word line index different bit cells in the memory array. In this scenario, parallel read and write operations can be concurrently performed successfully. However, when the read and write addresses are same, both the read and write word lines are indexed to the same memory bit cell. With this architecture, a successful read operation cannot be guaranteed. Finally, when the read and write addresses index the same row but a different column in the array, a potential functional failure occurs.

In the case where the read and write addresses index the same memory bit cells, two possibilities exist. First, if the write operation to the bit cell occurs before the read operation, the new data can be read from the bit cell. Second, if the read operation occurs before the new data is written to it, old data will be read from the bit cell. This particular sequencing is unpredictable. Moreover, the unpredictability can worsen due to mismatches of the transistors in the bit cell and to sensitivities to low operating voltages.

Additionally, potential functionality failure or high leakage currents may exist when accessing the same row of bit cells. If both the read word line 46 and the write word line 52 for the same memory row are on and the internal voltage of 'Q' at node 31 is at a low level, i.e., Q="0", the write bit line, WBIT, 18 starts discharging through the NMOS transistors 22 and 30. This causes the internal voltage at node 31 to increase to a certain level, for example, about 400 mv. This increase in the internal voltage can be seen as high or partial high by some transistors, particularly the read transistor 34. The false read current discharges the voltage on the read bit line 38 to an intermediate value between VDD and 0.6 VDD. This can flip the stages in the sensing logic and output driver circuitry 60 and cause a false read operation. In addition, the discharge of the read bit line 38 to an intermediate value can cause a large IDDQ current to the following stages. This can be aggravated with the word length of the memory, since the read and write bit lines span the entire word length.

The clocking functions that have been previously employed are illustrated in FIGS. 2 and 3, to which reference is now additionally made. The memory bit cell (or row of bit cells) 10 receive the read and write addresses AR/EZR and AW/EZW on input lines 40 and 48, as described above. The clock signal is received on line 42. These signals are applied to the internal read address latch/clock circuit 44 and write address latch/clock circuit 50, which provide internal clock signals on the write internal clock line WWL 52 and read internal clock line RWL 46. The waveforms of various clocking signals are shown in FIG. 3. The external clock signal 70 has a transition from low to high 72 for a first time period 74. The clock signal then transitions 76 back to a low state for a second time period 78 and cycle is repeated.

Meanwhile, the read address latch/clock circuit 44 and write address latch/clock circuit 50 cause the read word line 46 and write word line 52 to change states when the bit cell is addressed by the read and write address signals on lines 40 and 48. The state changes of the read word line 46 and write word line 52 are shown by waveforms 80 and 82, respectively, in FIG. 3. As shown, the clock waveforms of the read word line 46 and write word line 52 substantially follow the waveform of the external clock signal 70, having a high state during the first period 74 and a low state during the second period 78. During the first time period 74 when both the read and write signals are high, respective read and write operations are concurrently performed in the bit cell 10. Subsequently, during the second period 78 when the read and write signals are low, the read and write word lines are precharged for the next read and write operations.

It can be seen that the concurrent operations performed using this timing scenario result in the issues described in greater detail above. These issues have been addressed in the past by restricting simultaneous read and write operations in the same bit cell.

What is needed is a memory architecture and method for operating same that can achieve high performance and two-port functionality, that has the ability to perform read and write operations on the same bit cell during a single clock cycle, and that has a robust architecture that can reduce mismatch and allow low voltage operations.

SUMMARY

The example of the architecture for a 2-port memory disclosed herein achieves the high performance functionality and robustness without restricting the simultaneous read and write access and without the potential issues that caused the functional failures. The architecture is achieved by performing a read operation in the positive portion of a clock cycle and a write operation in the negative portion of the clock cycle. Write precharge takes place while performing a read operation, and read precharge takes place while performing a write operation.

According to one example, an 8T memory bit cell that is adapted for connection to receive a clock signal and read and write address signals is provided. The 8T memory bit cell has a read word line and a write word line. A read address latch/clock circuit receives the clock signal and the read address signals and initiates a read operation during a first clock cycle state. A write address flip-flop/clock circuit receives the clock signal and the write address signals and initiates a write operation during a second clock cycle state. In one embodiment, an inverter receives and inverts the clock signal and applies the inverted clock signal to the write address flip-flop/clock circuit. In one embodiment, the read address latch/clock circuit initiates a read word line precharge operation during the second clock cycle state and a write word line precharge operation during the first clock cycle state. In one embodiment, the write address flip-flop/clock circuit includes a loose self-timer, wherein if the low clock cycle state continues beyond a first predetermined time, the loose self-timer ends the write operation at a second predetermined time less than the first predetermined time.

According to another example, a memory array has a plurality of 8T memory bit cells, each for connection to receive a clock signal and read and write address signals. Each 8T memory bit cell has a read word line and a write word line. A read address latch/clock circuit for receives the clock signal and the read address signals to initiate a read operation during a first clock cycle state. A write address flip-flop/clock circuit receives the clock signal and the write address signals to initiate a write operation during a second clock cycle state. In one embodiment, an inverter receives and inverts the clock signal and applies the inverted clock signal to the write address flip-flop/clock circuit. In one embodiment, the read address latch/clock circuit initiates a read word line precharge operation during the second clock cycle state and a write word line precharge operation during the first clock cycle state. In one embodiment, the write address flip-flop/clock circuit includes a loose self-timer, wherein if the low clock cycle state continues beyond a first predetermined time, the loose self-timer ends the write operation at a second predetermined time less than the first predetermined time.

According to another example, a method for operating an 8T memory bit cell is described. The method includes applying a clock signal to the 8T memory bit cell. The clock signal has a first and second clock cycle states and a read operation is performed during the first clock cycle state, and a write operation is performed during a second clock cycle state. The first state may be a high state and the second state may be a low state. In one embodiment, the method further includes operating the read address latch/clock circuit to perform a read word line precharge operation during the low state and operating the write address flip-flop/clock circuit to perform a write word line precharge operation during the high state. The high and low states may occur within a single clock cycle. In one embodiment, the clock signals are inverted before said clock signal is applied to said write address flip-flop/clock circuit. In yet another embodiment, the method includes providing loose self-timing, wherein if the low state continues beyond a first predetermined time, the loose self-timing ends said write operation at a second predetermined time less than the first predetermined time.

BRIEF DESCRIPTION OF THE DRAWINGS

In the various figures of the drawing, like reference numbers are used to denote like or similar parts.

DETAILED DESCRIPTION

Figure 1:
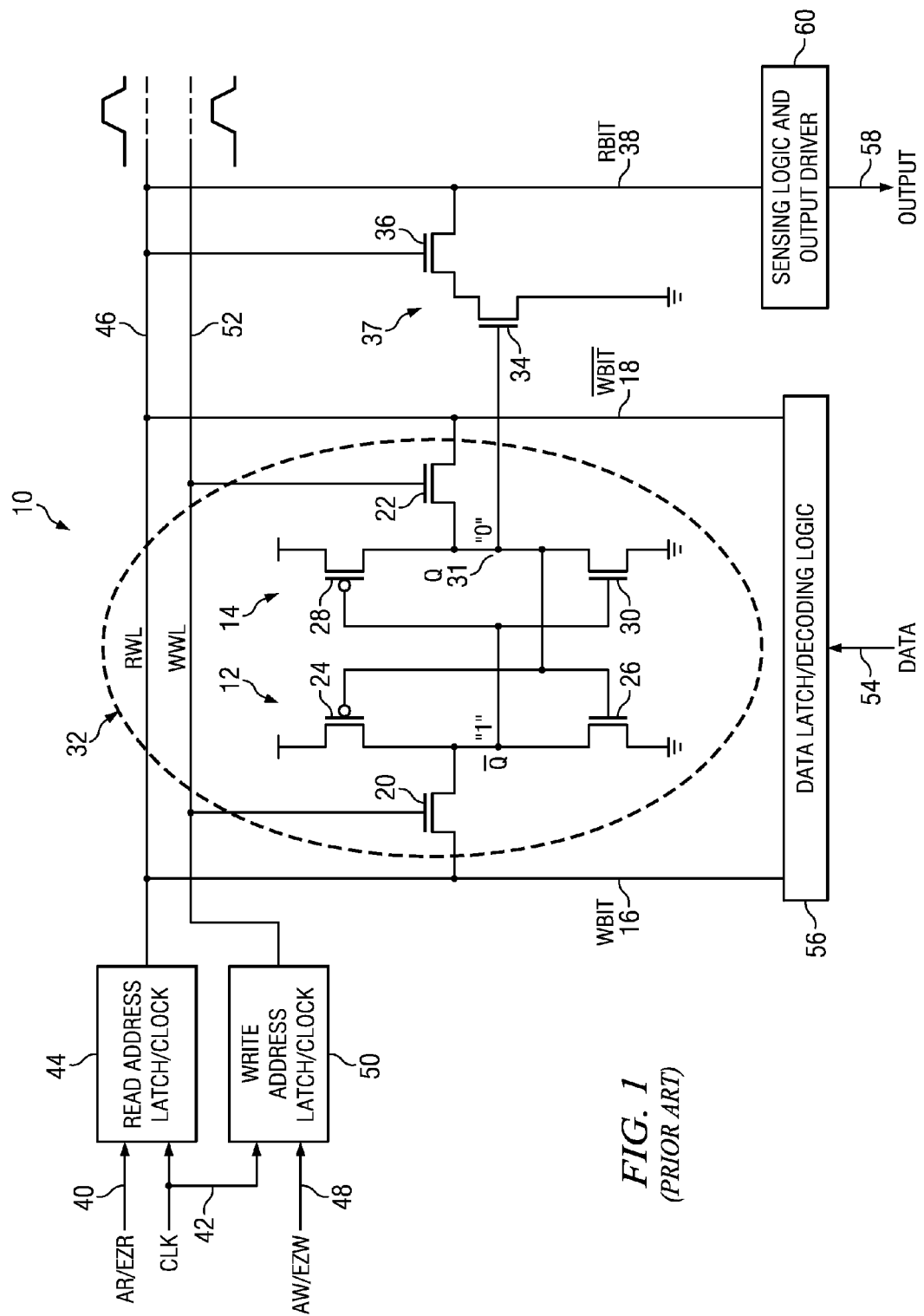
FIG. 1 is an electrical schematic diagram of a single bit cell of an array of bit cells showing the construction of a typical 8T memory cell.
Figure 2:
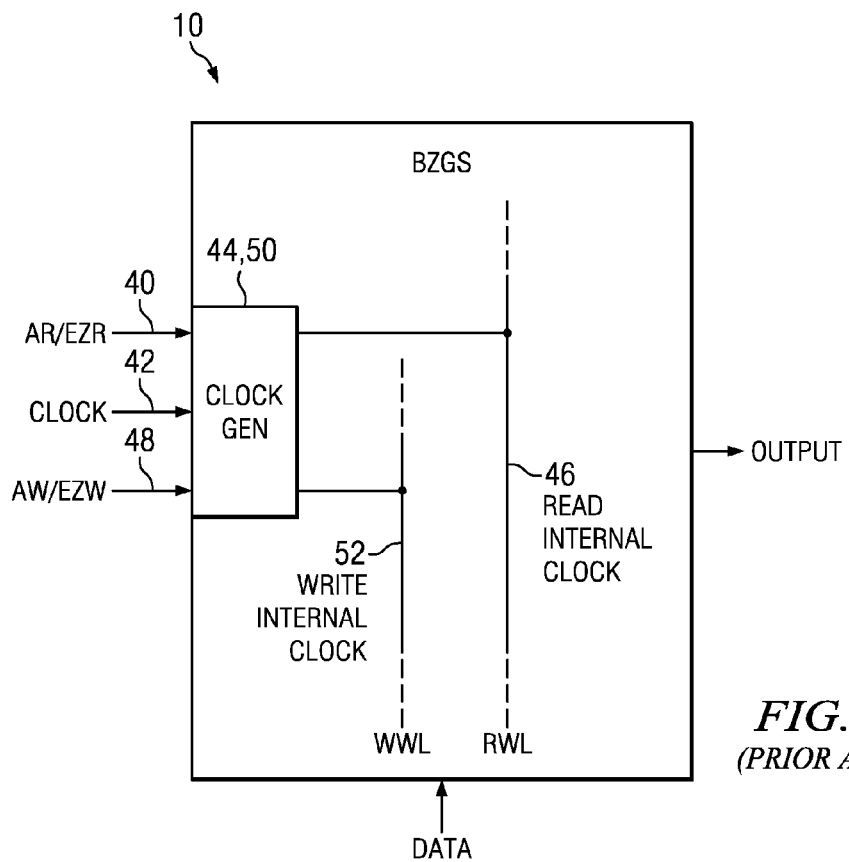
FIG. 2 is a block diagram showing an abstracted form of the 8T memory cell of FIG. 1.
Figure 3:
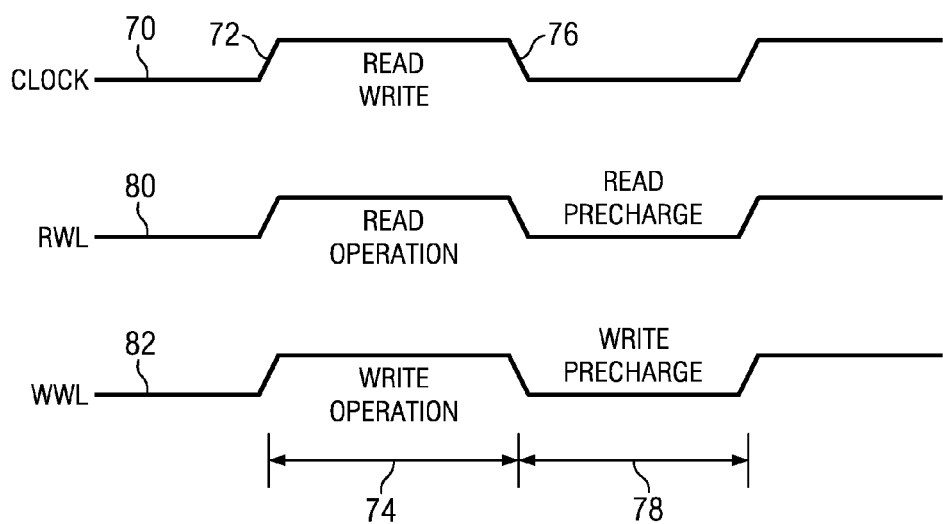
FIG. 3 shows waveforms of the external clock, read word line, and write word line employed in the operation of the 8T memory cell of FIGS. 1 and 2.
Figure 4:
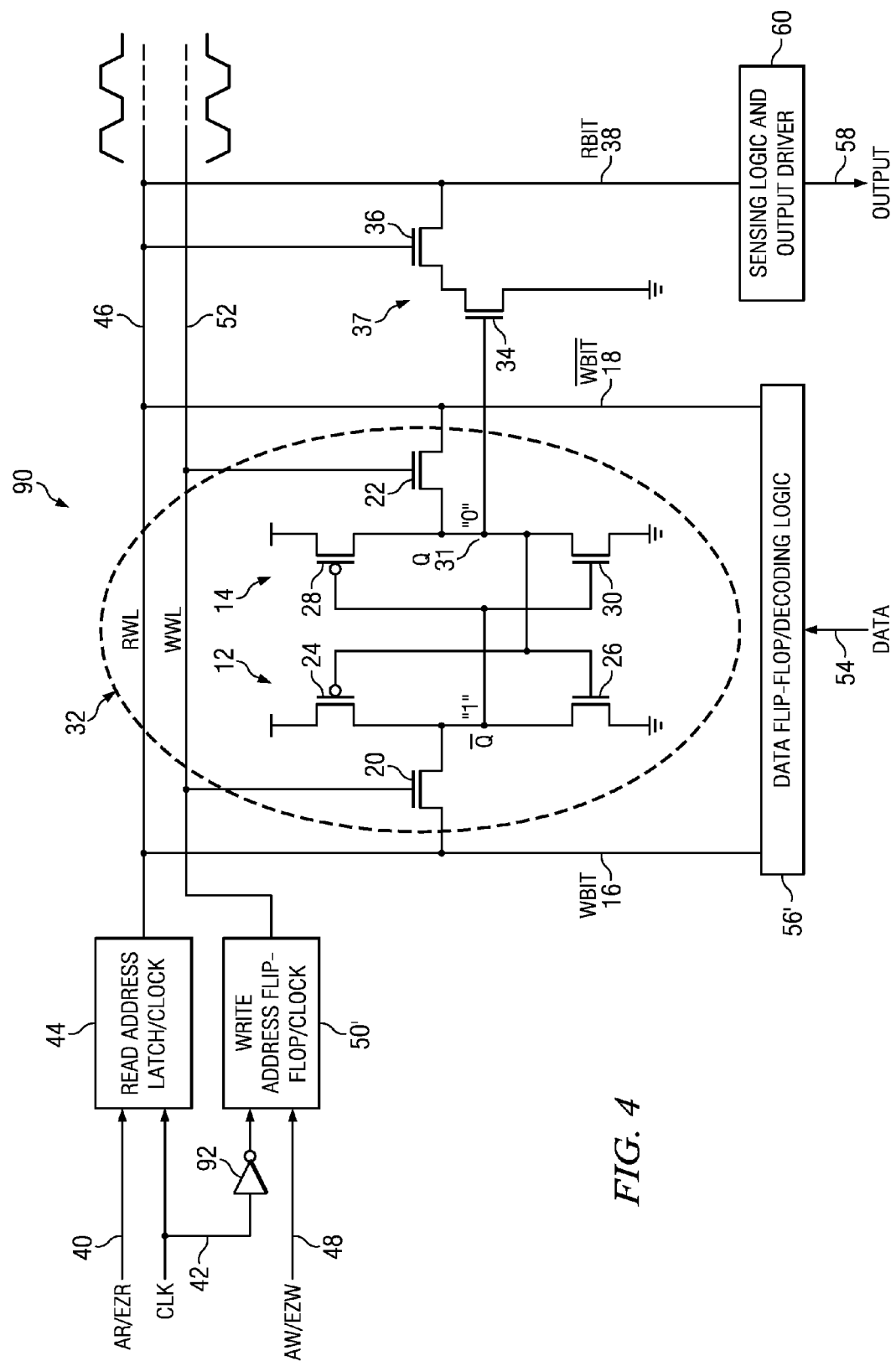
FIG. 4 is an electrical schematic diagram of an example of an 8T memory bit cell having a structure that can achieve high performance and two-port functionality, that has the ability to perform read and write operations on the same bit cell during a single clock cycle, and that has a robust architecture that can reduce mismatch and allow low voltage operations.

FIG. 4, to which reference is now additionally made, is an electrical schematic diagram of an example of an 8T memory bit cell 90 having a structure that can achieve high performance and two-port functionality, that has the ability to perform read and write operations on the same bit cell during a single clock cycle, and that has a robust architecture that can reduce mismatch and allow low voltage operations. The memory bit cell 90 may be substantially the same as the 8T memory bit cell 10 of FIG. 1; however, means are included for changing the phase of the read and write signals. In the example illustrated, and inverter 92 is provided to invert the external clock signal on line 42 that is applied to clock the write address signal on line 48. The addition of the inverter 92 has a number of advantages in that it requires very little additional space on the chip on which the circuit 90 is constructed, and has little, if any, effect on the performance of the memory.

The inverter 92 enables read and write operations to be performed on opposite clock edges. Thus, read operations occur in the positive half of the clock cycle, and write operations occur in the negative half of the clock cycle. This can be seen with reference now to FIGS. 5 and 6, which show, respectively, a block diagram showing an abstracted form of the 8T memory cell 90 of FIG. 4 and waveforms of the external clock 94, read word line 96, and write word line 98 of the 8T memory cell 90.

Figure 5:
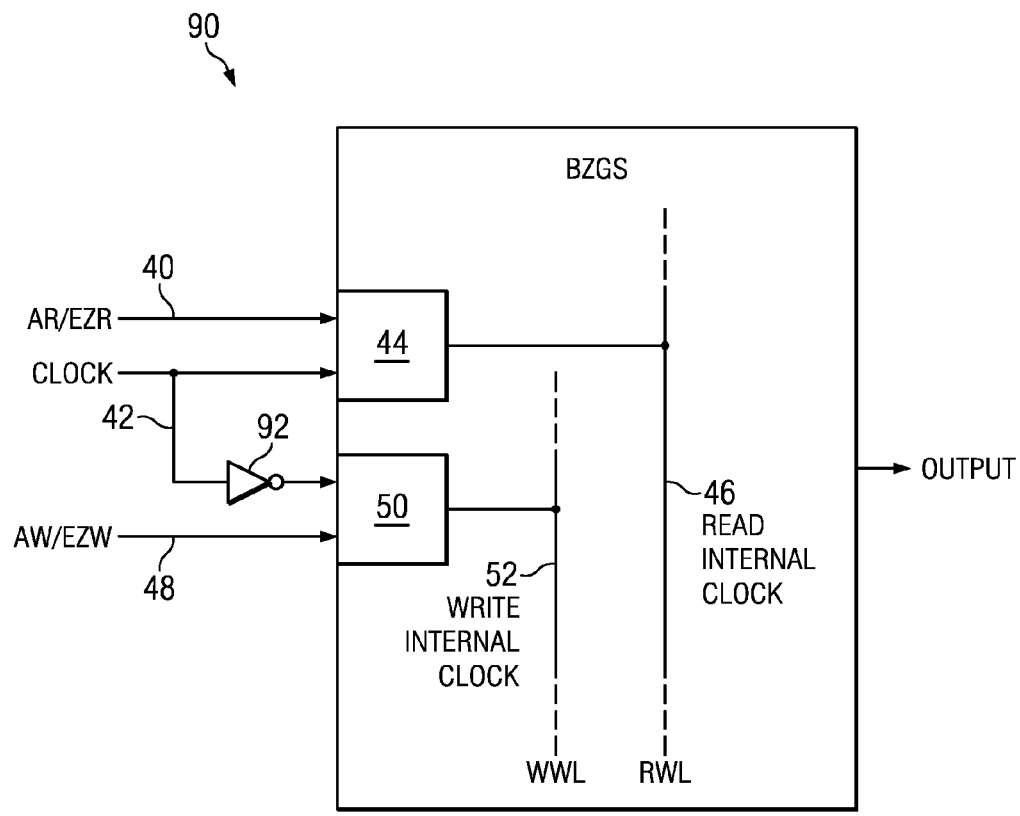
FIG. 5 is a block diagram showing an abstracted form of the 8T memory cell of FIG. 4.
Figure 6:
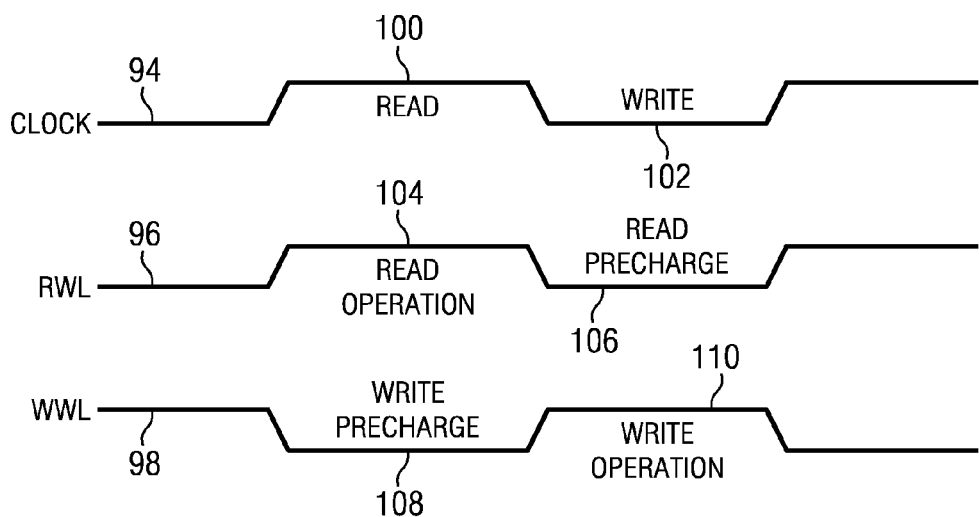
FIG. 6 shows waveforms of the external clock, read word line, and write word line employed in the operation of the 8T memory cell of FIGS. 4 and 5.

As shown in FIG. 5, the read operations occur in the positive half of the clock cycle 100, and write operations occur in the negative half of the clock cycle 102. Thus, as shown by the read word line waveform 96, during the first half of the clock cycle 100, a read operation is performed while the read word line 46 is high, shown by the waveform 104. During the second half of the clock waveform when the clock waveform is low 102, the read word line 46 is also low 106, during which time the read word line 46 is precharged for a subsequent read operation.

In contrast, as shown by the write word line waveform 98, during the first half of the clock cycle 100, when the first half of the clock waveform 100 is high, the write word line 52 is low 108, during which time the write word line 52 is pre-charged for a subsequent read operation. Then, a write operation is performed while the clock signal is low 102 and the write word line 52 is high, shown by the waveform 110.

As a result of the inverted write line signal, any potential functional failure or high leakage current when accessing the same row of bit cells is substantially eliminated. The read/write sequence change allows write and read operation to be performed independently and substantially in parallel, while meeting same performance goals that limited previous memory architectures. Moreover, the sequence described can be achieved without increasing the area required for construction of the memory cell array, which could have not been possible with other architectures.

Figure 7:
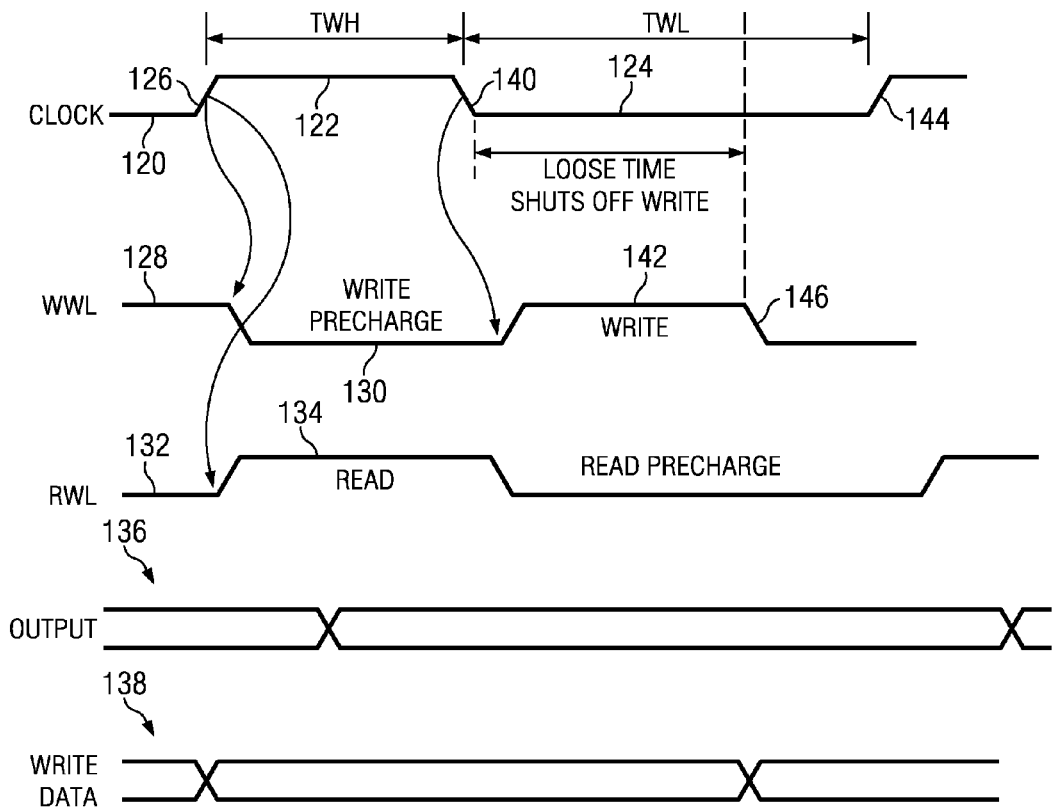
FIG. 7 shows waveforms illustrating a mode of operation in which word line timing can be turned off if a low clock phase exists longer than a predetermined time.

An additional advantage that is enabled by the read/write sequence described is that "loose self-timing" can be used. In the operation of a memory cell in many applications, the low phase of the memory clock may be extended for a relatively long duration, which may unintentionally enable the write word line. This may cause reliability issues in the bit cells of the memory. To achieve the loose self-timing, a self-timing path may be added to the write word line address flip-flop/clock circuit 50' (see FIG. 4). This is illustrated in FIG. 7 to which reference is now additionally made.

As shown, the clock signal 120 has a high period TWH 122 followed by a low period TWL 124. The clock waveform 120 may be asymmetrical, as shown, having an extended low period 124. The rising clock edge 126 triggers the write word line signal 128 to go low 130, initiating a write precharge operation. The rising clock edge 126 also triggers the read word line signal 132 to go high 134, initiating a read operation. The read operation produces a memory output 136. Meanwhile, the write data 138 is applied to the memory input to be written to the memory cells during the subsequent write operation in the clock cycle.

When the clock signal 120 falls, the falling edge 140 of the clock signal 120 causes the write word line signal 128 to go high 142 triggering the write operation. However, the rising edge 144 of the low clock signal 124 triggering the end 146 of the write operation is delayed. Thus, the end 146 of the write operation is triggered by the loose time control in the write address flip-flop/clock circuit 50'. Thus, if the low clock signal 124 continues beyond a first predetermined time or the low phase continues for an infinitely long time, reliability issues may be caused in the bit cell 90, causing functionality loss of the bit cell. To avoid this, the loose self-time closes the internal write word line.

Figure 8:
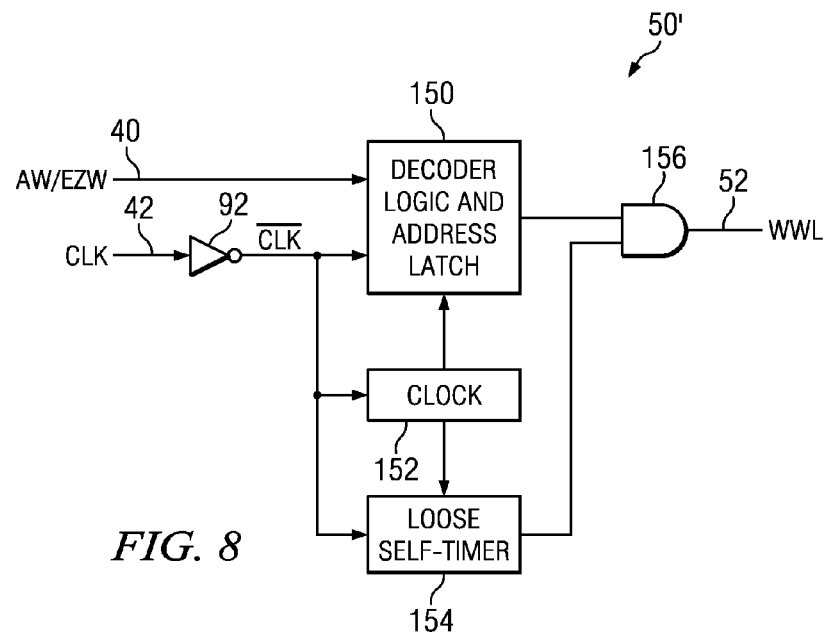
FIG. 8 is a functional block diagram of a write address flip-flop/clock circuit of the type that may be used to control word line timing.

FIG. 8 is a functional block diagram of a write address flip-flop/clock circuit 50' of the type that may be used to control word line timing. As shown, the inverted clock signal and word line address are applied to a decoder logic and address flip-flop/circuit 150, the output of which is applied to one input of an AND gate 156. The inverted clock signal is also applied to an internal clock circuit 152 and a timer 154. The output of the timer is applied to another input of the AND gate 156. The output of the AND gate 156 supplies signals to the write word line (WWL) 52.

Thus, in operation, when the clock signal on line 42 goes low, the inverted clock signal on line 160 goes high, latching the write address. If the write address that is latched addresses the write word line 52 an output signal is asserted to one input of the AND gate 156. At the same time, the inverted clock signal initiates a self-timing operation by the timer 154, which has a normally high output. If the inverted clock signal remains high longer than a predetermined period, the timer changes output states to assert a low signal to the AND gate 156, shutting off the write operation enabled by the state of the write word line 52. If the inverted clock signal changes state before the expiration of the time established by the timer 154, the output state of the decoder logic and address latch changes state, again shutting off the output from the AND gate 156 and the write operation enabled by the state of the write word line 52.

Figure 9A:
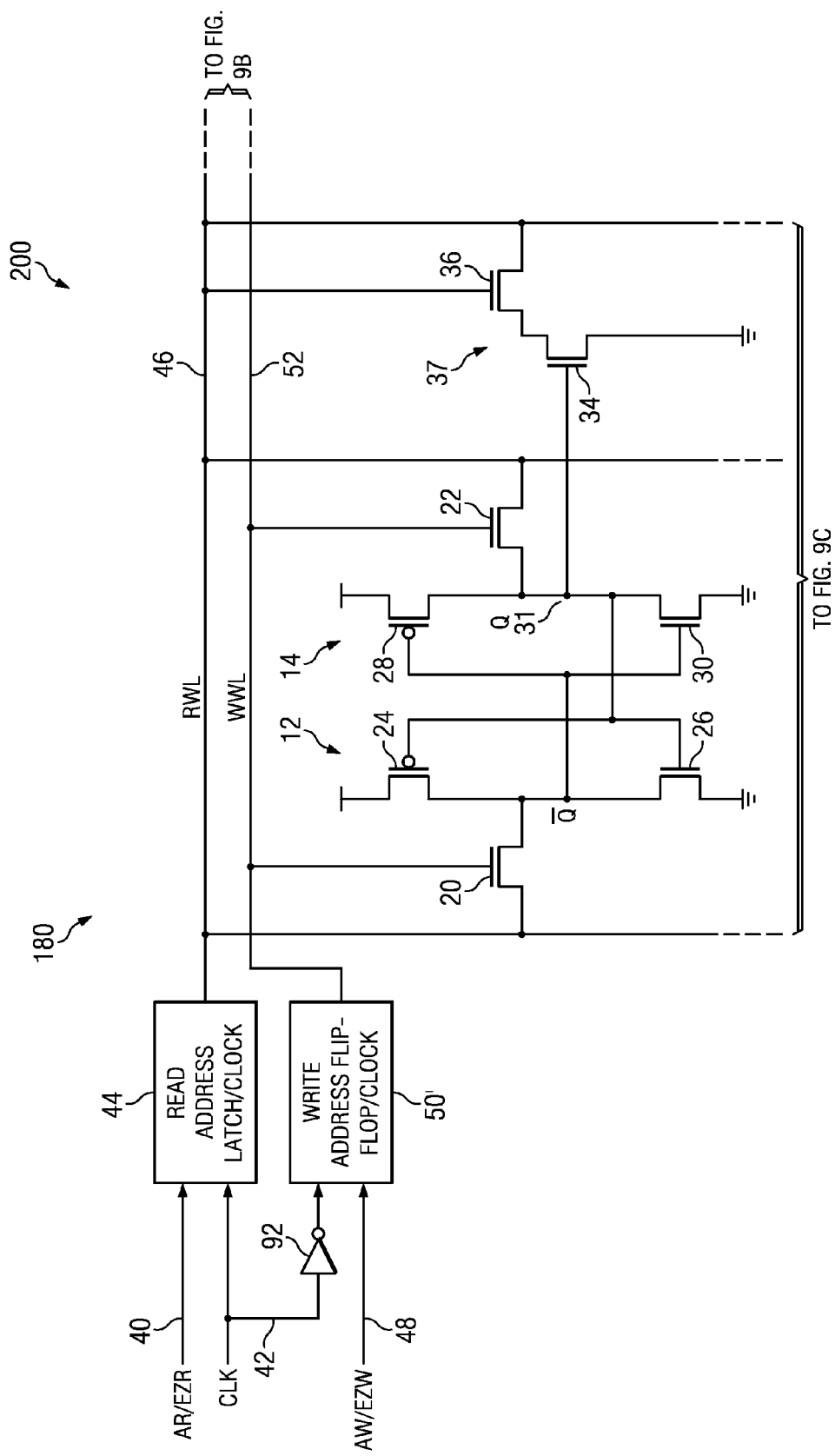
FIG. 9 is an electrical schematic diagram of a portion of a memory array including a plurality of bit cells that can perform read and write operations on the same bit cell during a single clock cycle.
Figure 9C:
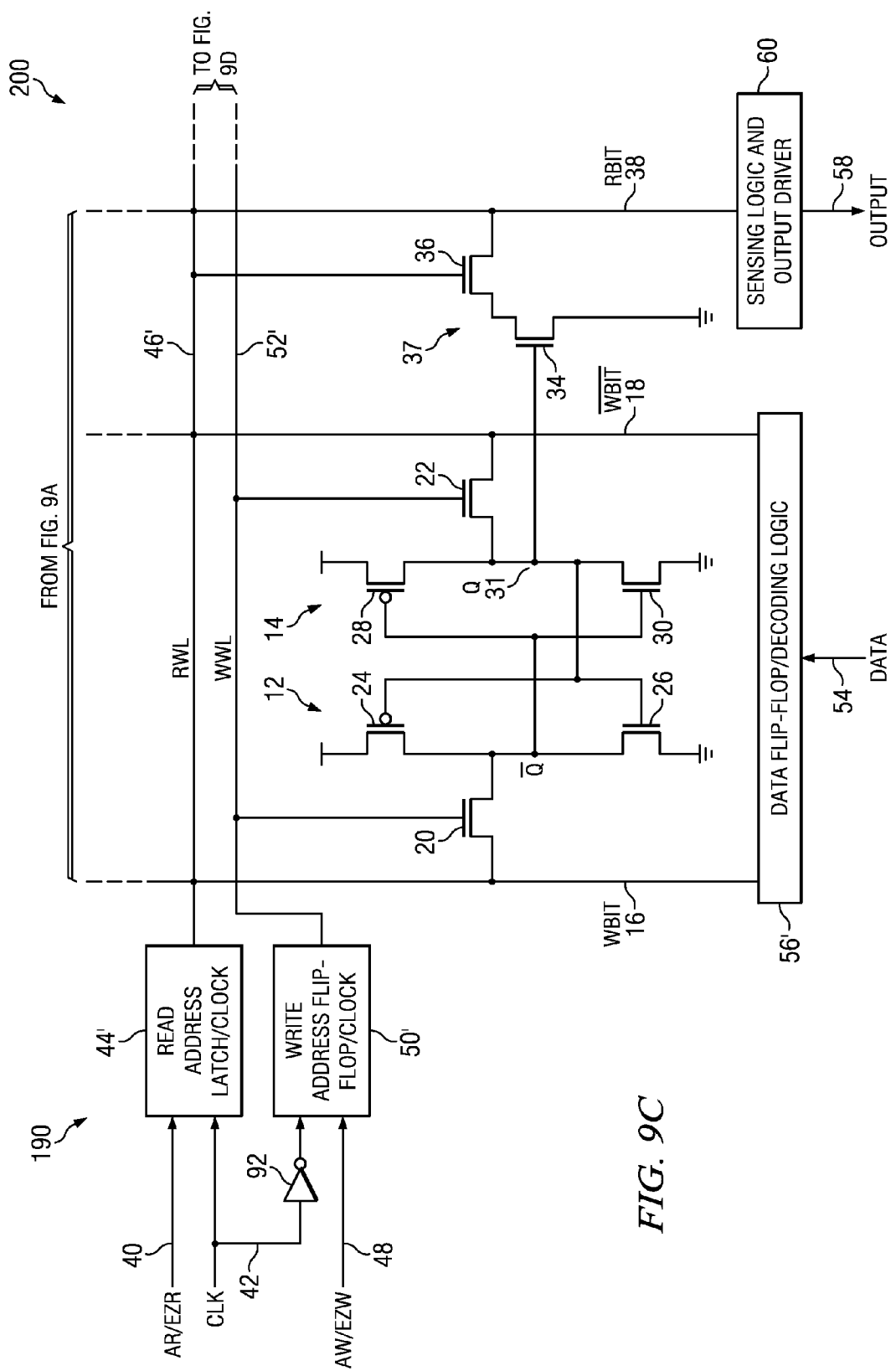
Figure 9D:
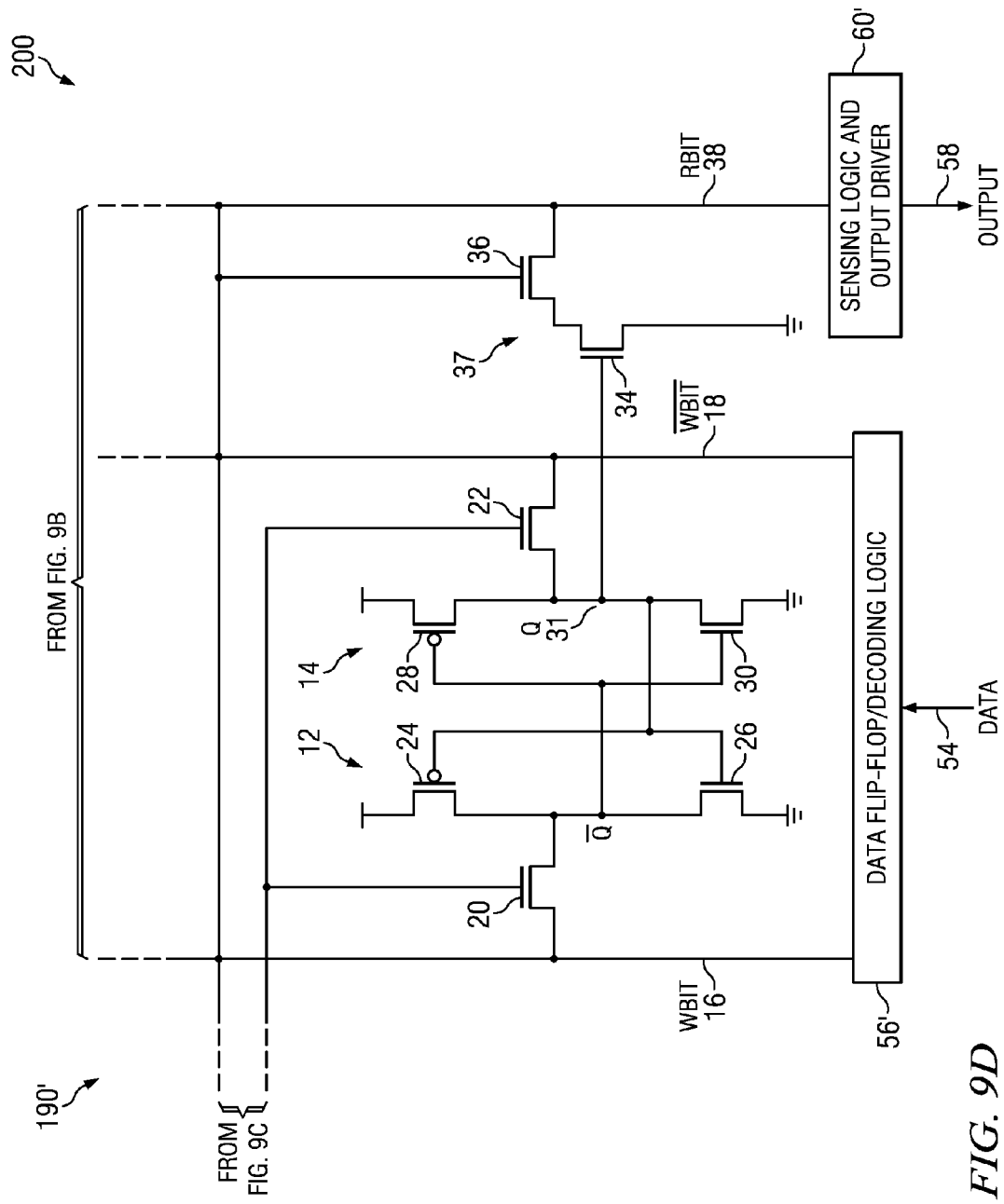

FIG. 9 is an electrical schematic diagram of a portion of a memory array 200 in which a plurality of substantially similar bit cells 180 ... 180', 190 ... 190' of the type described in FIG. 4 may be instantiated. As shown, the bit cells 180 ... 180', 190 ... 190' are arranged in rows and columns whereby an entire word along an addressed word write line 52 ... 52' and word read line 46 ... 46' can be written to or read from according to the timing described above with respect to FIG. 6 above.

Electrical connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. An 8T memory bit cell for connection to receive a clock signal and read and write address signals, comprising:
   a read word line;
   a write word line;
   a read address latch/clock circuit for receiving said clock signal and said read address signals to initiate a read operation during a first clock cycle state;
   a write address flip-flop/clock circuit for receiving said clock signal and said write address signals to initiate a write operation during a second clock cycle state; and
   an inverter for receiving and inverting said clock signal and for applying said inverted clock signal to said write address flip-flop/clock circuit;
   wherein said read address latch/clock circuit initiates a read word line precharge operation during said second clock cycle state and write address flip-flop/clock circuit initiates a write word line precharge operation during said first clock cycle state.

2. The 8T memory bit cell of claim 1 wherein said first clock cycle state is a high clock cycle state and said second clock cycle state is a low clock cycle state.

3. The 8T memory bit cell of claim 1 wherein said high and low clock states occur within a single clock cycle.

4. The 8T memory bit cell of claim 1 wherein said write address flip-flop/clock circuit comprises a loose self-timer, wherein if said low clock cycle state continues beyond a first predetermined time, said loose self-timer ends said write operation at a second predetermined time less than said first predetermined time.

5. A memory array, comprising:
   a plurality of 8T memory bit cells, each for connection to receive a clock signal and read and write address signals, each 8T memory bit cell comprises:
   a read word line;
   a write word line;
   a read address latch/clock circuit for receiving said clock signal and said read address signals to initiate a read operation during a first clock cycle state;
   a write address flip-flop/clock circuit for receiving said clock signal and said write address signals to initiate a write operation during a second clock cycle state; and
   an inverter for receiving and inverting said clock signal and for applying said inverted clock signal to said write address flip-flop/clock circuit;
   wherein said read address latch/clock circuit initiates a read word line precharge operation during said second clock cycle state and write address flip-flop/clock circuit initiates a write word line precharge operation during said first clock cycle state.

6. The memory array of claim 5 wherein said first clock cycle state is a high state and said second clock cycle state is a low state.

7. The memory array of claim 6 wherein said high and low clock states occur within a single clock cycle.

8. The memory array of claim 7 wherein said read and write operations occur during said single clock cycle.

9. The memory array of claim 8 wherein said read operation occurs during a high phase of said single clock cycle and said write operation occurs during a low phase of said single clock cycle.

10. A memory array, comprising:
    a plurality of 8T memory bit cells, each for connection to receive a clock signal and read and write address signals, each 8T memory bit cell comprises:
    a read word line;
    a write word line;
    a read address latch/clock circuit for receiving said clock signal and said read address signals to initiate a read operation during a first clock cycle state; and
    a write address flip-flop/clock circuit for receiving said clock signal and said write address signals to initiate a write operation during a second clock cycle state;
    wherein said write address flip-flop/clock circuit comprises a loose self-timer, wherein if said low clock cycle state continues beyond a first predetermined time, said loose self-timer facility ends said write operation at a second predetermined time less than said first predetermined time.

11. A method for operating an 8T memory bit cell, comprising:
    applying a clock signal to said 8T memory bit cell, said clock signal having a first and second clock cycle states;
    performing a read operation during said first clock state;
    performing a write operation during said second clock state; and
    operating said read address latch/clock circuit to perform a read word line precharge operation during said second clock state and operating said write address flip-flop/clock circuit to perform a write word line precharge operation during said first clock state.

12. The method of claim 11 wherein said first clock state is a high state and said second clock state is a low state.

13. A method for operating an 8T memory bit cell, comprising:
    applying a clock signal to said 8T memory bit cell, said clock signal having a first and second clock cycle states;
    performing a read operation during said first clock state;
    performing a write operation during said second clock state; and
    providing a read address latch/clock circuit and a corresponding read word line, and a write address flip-flop/clock circuit and a corresponding write word line, wherein said applying said clock signal to said 8T memory bit cell comprises applying said clock signal to said read address latch/clock circuit and said write address flip-flop/clock circuit.

14. The method of claim 12 further comprising inverting said clock signal before said clock signal is applied to said write address flip-flop/clock circuit.

15. The method of claim 12 further comprising providing loose self-timing wherein if said low state continues beyond a first predetermined time, said loose self-timing ends said write operation at a second predetermined time less than said first predetermined time.

\* \* \* \* \*